(12) United States Patent
Yang et al.

(10) Patent No.: US 8,659,156 B2
(45) Date of Patent: Feb. 25, 2014

(54) INTERCONNECT STRUCTURE WITH AN ELECTROMIGRATION AND STRESS MIGRATION ENHANCEMENT LINER

(75) Inventors: Chih-Chao Yang, Glenmont, NY (US); Baozhen Li, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 13/275,352

(22) Filed: Oct. 18, 2011

(65) Prior Publication Data
US 2013/0093089 A1 Apr. 18, 2013

(51) Int. Cl.
*H01L 21/768* (2006.01)
(52) U.S. Cl.
CPC ....... *H01L 21/7684* (2013.01); *H01L 21/76849* (2013.01)
USPC .......................................... 257/751; 257/767
(58) Field of Classification Search
CPC ............ H01L 21/7685; H01L 23/5226; H01L 21/76849
USPC ........... 257/751, 767, 771–775; 438/618, 643
See application file for complete search history.

(56) References Cited

U.S. PATENT DOCUMENTS

| | | | |
|---|---|---|---|
| 5,098,860 A | 3/1992 | Chakravorty et al. | |
| 5,930,669 A | 7/1999 | Uzoh | |
| 5,933,753 A | 8/1999 | Simon et al. | |
| 6,383,920 B1 | 5/2002 | Wang et al. | |
| 6,429,519 B1 | 8/2002 | Uzoh | |
| 7,319,072 B2 | 1/2008 | Kurata et al. | |
| 7,538,024 B2 | 5/2009 | Teng et al. | |
| 7,709,905 B2 | 5/2010 | McDevitt et al. | |
| 7,709,958 B2 * | 5/2010 | Cohen | 257/762 |
| 7,732,331 B2 | 6/2010 | Kim et al. | |
| 7,872,351 B2 | 1/2011 | Kim et al. | |
| 7,880,303 B2 | 2/2011 | Yu et al. | |
| 7,960,832 B2 | 6/2011 | Koerner | |
| 7,982,312 B2 | 7/2011 | Colburn et al. | |
| 2006/0252250 A1 * | 11/2006 | Teng et al. | 438/618 |
| 2006/0286800 A1 | 12/2006 | Dominguez et al. | |

(Continued)

OTHER PUBLICATIONS

Guillaumond, J.F., et al., "Influence of Diffusion Barrier on Reliability. Identification of Diffusion Paths in Cu/Porous Low K Interconnect", IEEE 43rd Annual International Relability Physics Symposium, Apr. 17-21, 2005, pp. 660-661.
Heylen, N., et al., "CMP process optimization for improved compatibility with advanced metal liners", Interconnect Technology Conference (IITC), 2010 International, Issue Date: Jun. 6-9, 2010, pp. 1-3.

(Continued)

*Primary Examiner* — Tom Thomas
*Assistant Examiner* — John Bodnar
(74) *Attorney, Agent, or Firm* — Scully, Scott, Murphy & Presser, P.C.; Catherine Ivers, Esq.

(57) ABSTRACT

An electromigration and stress migration enhancement liner is provided for use in an interconnect structure. The liner includes a metal that has a thickness at a bottom of the at least one via opening and on an exposed portion of an underlying conductive feature that is greater than a remaining thickness that is located on exposed sidewalls of the interconnect dielectric material. The thinner portion of the electromigration and stress migration enhancement liner is located between the interconnect dielectric material and an overlying diffusion barrier. The thicker portion of the electromigration and stress migration enhancement liner is located between the underlying conductive feature and the diffusion barrier as well as between an adjacent dielectric capping layer and the diffusion barrier. The remainder of the at least one via opening is filled with an adhesion layer and a conductive material.

19 Claims, 3 Drawing Sheets

(56) References Cited

U.S. PATENT DOCUMENTS

| | | | |
|---|---|---|---|
| 2007/0267751 A1* | 11/2007 | Yang et al. | 257/758 |
| 2010/0164111 A1* | 7/2010 | Yang et al. | 257/758 |
| 2010/0227473 A1* | 9/2010 | Matsuda et al. | 438/653 |
| 2010/0314765 A1* | 12/2010 | Liang et al. | 257/751 |
| 2010/0320607 A1* | 12/2010 | Suzuki | 257/751 |
| 2011/0084393 A1* | 4/2011 | Cabral et al. | 257/751 |

OTHER PUBLICATIONS

Tagami, M., et al., "Improvement of RC Performance for advanced ULK/Cu Interconnects with CVD Hybrid Dielectric/Metal Liner",: Interconnect Technology Conference and 2011 Materials for Advanced Metallization (IITC/MAM), 2011 IEEE International, Issue Date: May 8-12, 2011, pp. 1-3.

* cited by examiner

INTERCONNECT STRUCTURE WITH AN ELECTROMIGRATION AND STRESS MIGRATION ENHANCEMENT LINER

BACKGROUND

The present disclosure relates to a semiconductor structure and a method of forming the same. More particularly, the present disclosure relates to an interconnect structure containing an electromigration and stress migration enhancement liner located between a patterned interconnect dielectric material and a diffusion barrier. The present disclosure also relates to a method of forming such an interconnect structure.

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, -based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than silicon dioxide.

In typical interconnect structures, good liner coverage has been a challenge. This is particularly true in a via of a dual damascene interconnect structure. Problems associated with poor liner coverage include: (i) early device failure for via depletion electromigration; (ii) early device failure of stress migration with plate above type structures; and (iii) degradation of the Blech effect. This effect, also known as stress-induced backflow, was coined after IA Blech, who first reported this phenomenon for aluminum metal lines. The Belch effect can be summarized as follows: as the metal ions move toward the anode end of the metal line, stress build-up occurs opposing the electron flow, thus constraining void growth which can lead to device failure.

There is a need for providing a method and structure which avoids the aforementioned problems associated with prior art interconnect structures, without negatively effecting time-dependent-dielectric breakdown (TDDB) performance and/or increasing the resistance of the via. By "TDDB" it is meant that overtime the dielectric material of the interconnect structure begins to fail. The failure of the dielectric material may be caused by intrinsic means or by defects that are formed on the surface of the interconnect dielectric during the course of preparing the interconnect structure.

SUMMARY

An electromigration and stress migration enhancement liner is provided for use in an interconnect structure that includes an interconnect dielectric material that has a least one via opening located therein. The electromigration and stress migration enhancement liner includes a metal that has a thickness at a bottom of the at least one via opening and on an exposed portion of an underlying conductive feature that is greater than a remaining thickness that is located on exposed sidewalls of the interconnect dielectric material. The thinner portion of the electromigration and stress migration enhancement liner is located between the interconnect dielectric material and an overlying diffusion barrier. The thicker portion of the electromigration and stress migration enhancement liner is located between the underlying conductive feature and the diffusion barrier as well as between an adjacent dielectric capping layer and the diffusion barrier. The remainder of the at least one via opening is filled with an adhesion layer and a conductive material.

Since the electromigration and stress migration enhancement liner is thicker at a bottom portion of the at least one via opening than other portions of the at least one via opening, the thicker bottom portion of the electromigration and stress migration enhancement liner is capable of blocking diffusion of the overlying conductive material while not significantly increasing the resistance of the via. Also, the electromigration and stress migration enhancement liner/conductive feature interface located at the bottom portion of the at least one via opening should improve the "slide" void problem for line depletion electromigration.

With respect to the other portions of the electromigration and stress migration enhancement liner that are thinner than the portion at the bottom of the at least one via opening, the thinner portion of the electromigration and stress migration enhancement liner helps to reduce early device failure associated with via depletion electromigration.

In one aspect of the present disclosure an interconnect structure is provided. The interconnect structure includes a first interconnect dielectric material having at least one conductive feature located therein. A dielectric capping layer is located atop the first interconnect dielectric material and a portion of the at least one conductive feature. A second interconnect dielectric material having at least one via opening that is in contact with an exposed portion of the at least one conductive feature is located on the dielectric capping layer. An electromigration and stress migration enhancement liner is located within the at least one via opening. The electromigration and stress migration enhancement liner includes a metal that has a thickness at a bottom of the at least one via opening and on the exposed portion of the at least one conductive feature that is at least 3 times greater than a remaining thickness that is located on exposed sidewalls of the second interconnect dielectric material. The structure further includes a diffusion barrier located on the electromigration and stress migration enhancement liner and within the at least one via opening. An adhesion liner is located on the diffusion barrier and within the at least one via opening. The structure yet further includes a conductive region located on the adhesion liner and within the at least one via opening.

In another aspect of the present disclosure a method of forming an interconnect structure is provided. The method includes forming a first interconnect dielectric material having at least one conductive feature located therein. A dielectric capping layer is then formed atop the first interconnect dielectric material. Next, a second interconnect dielectric material having at least one via opening that extends through the second interconnect dielectric material and the dielectric capping layer is formed. An electromigration and stress migration enhancement liner is then formed within the at least one via opening. The electromigration and stress migration enhancement liner includes a metal that has a thickness at a bottom of the at least one via opening and on an exposed portion of the at least one conductive feature that is at least 3 times greater than a remaining thickness that is located on exposed sidewalls of the second interconnect dielectric material. Next, a diffusion barrier is formed on the electromigration and stress migration enhancement liner and within the at least one via opening. An adhesion liner is then formed on the diffusion barrier and within the at least one via opening, and thereafter, a conductive region is formed on the adhesion liner and within the at least one via opening.

DETAILED DESCRIPTION

The present disclosure, which provides an interconnect structure containing an electromigration and stress migration enhancement liner having a thicker portion located at a bottom of a via as compared to the remaining portions of the via and a method of forming the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, an electromigration and stress migration enhancement liner is provided for use in an interconnect structure that includes an interconnect dielectric material that has a least one via opening located therein. The electromigration and stress migration enhancement liner includes a metal that has a thickness at a bottom of the at least one via opening and on an exposed portion of an underlying conductive feature that is greater than a remaining thickness that is located on exposed sidewalls of the interconnect dielectric material. The thinner portion of the electromigration and stress migration enhancement liner is located between the interconnect dielectric material and an overlying diffusion barrier. The thicker portion of the electromigration and stress migration enhancement liner is located between the underlying conductive feature and the diffusion barrier as well as between an adjacent dielectric capping layer and the diffusion barrier. The remainder of the at least one via opening is filled with an adhesion layer and a conductive material.

Figure 1:
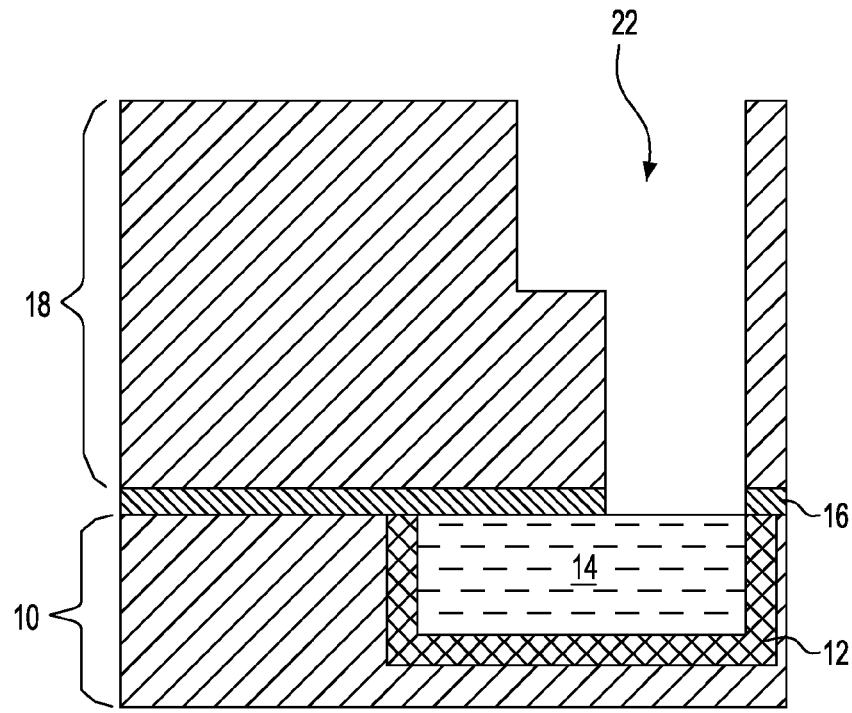
FIG. 1 is a pictorial representation (through a cross sectional view) depicting a partially completed interconnect structure including at least one via opening located within an interconnect dielectric material that can be employed in one embodiment of the present disclosure.

Reference is first made to FIG. 1 which illustrates a partially completed interconnect structure that can be employed in the present disclosure. Specifically, the partially completed interconnect structure shown in FIG. 1 comprises a multilevel interconnect including a lower interconnect level and an upper interconnect level that are separated in part by dielectric capping layer 16. The lower interconnect level, which may be located above a semiconductor substrate including one or more semiconductor devices, comprises a first interconnect dielectric material 10 having at least one conductive feature (i.e., conductive region) 14 embedded therein. The at least one conductive feature 14 is separated from the first interconnect dielectric material 10 by a barrier layer 12. The upper interconnect level comprises a second interconnect dielectric material 18 that has at least one via opening 22 located therein. In FIG. 1, the at least one via opening 22 is shown as a combined via and a line opening for a dual damascene structure. Although the drawings illustrate the via opening as being part of a combined via and line opening, the present disclosure also contemplates embodiments when only a via opening is formed.

A via opening is an opening that runs perpendicular to the underlying substrate and it generally has a width, as measured from one sidewall to another sidewall, of from 10 nm to 200 nm. A line opening which runs parallel to the underlying substrate has a width that is much greater than the width of the via opening. In the embodiment in which a combined via and line opening is formed, the line opening is located directly atop and is in communication with an underlying via opening.

The partially completed interconnect structure shown in FIG. 1 is formed utilizing standard interconnect processing which is well known in the art. For example, the partially completed interconnect structure shown in FIG. 1 can be formed by first applying the first interconnect dielectric material 10 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other IIIN or II/VI compound semiconductors may be used. In addition to these listed types of semiconducting materials, the present disclosure also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first interconnect dielectric material 10 of the lower interconnect level may comprise any interlevel or intralevel dielectric including inorganic dielectrics or organic dielectrics. The first interconnect dielectric material 10 may be porous or non-porous. Porous dielectric materials generally have a lower dielectric constant than the non-porous counterparts. Some examples of suitable dielectrics that can be used as the first interconnect dielectric material 10 include, but are not limited to, $SiO_2$, silsesquixoanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In one embodiment, the first interconnect dielectric material 10 has a dielectric constant that is about 4.0 or less. In another embodiment, the first interconnect dielectric material 10 has a dielectric constant of about 2.8 or less. All dielectric constants mentioned in this disclosure are relative to a vacuum unless otherwise noted. Dielectrics having a dielectric constant of about 4.0 or less generally have a lower parasitic crosstalk as compared with dielectric materials that have a higher dielectric constant than 4.0. The thickness of the first interconnect dielectric material 10 may vary depending upon the dielectric material used as well as the exact number of dielectrics within the lower interconnect level. Typically, and for normal interconnect structures, the first interconnect dielectric material 10 has a thickness from 200 nm to 450 nm.

The lower interconnect level also has at least one conductive feature 14 that is embedded in (i.e., located within) the first interconnect dielectric material 10. The at least one conductive feature 14 comprises a conductive region that is separated from the first interconnect dielectric material 10 by a barrier layer 12. The at least one conductive feature 14 can be formed by lithography (i.e., applying a photoresist to the surface of the first interconnect dielectric material 10, exposing the photoresist to a desired pattern of radiation, and developing the exposed resist utilizing a conventional resist developer), etching (dry etching or wet etching) an opening in the first interconnect dielectric material 10 and filling the etched region with the barrier layer 12 and then with a conductive material.

The barrier layer 12, which may comprise Ta, TaN, Ti, TiN, Ru, RuN, W, WN or any other material that can serve as a barrier to prevent conductive material from diffusing there through, can be formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. Combinations of the above mentioned barrier materials can also be employed as diffusion barrier 12. The thickness of the barrier layer 12 may vary depending on the exact means of the deposition process as well as the material employed. Typically, the barrier layer 12 has a thickness from 4 nm to 40 nm, with a thickness from 7 nm to 20 nm being more typical.

Following formation of the barrier layer 12, the remaining region of the opening within the first interconnect dielectric material 10 is filled with a conductive material and planarized forming the at least one conductive feature 14. The conductive material used in forming the at least one conductive feature 14 includes, for example, polySi, a conductive metal, an alloy comprising at least two conductive metals, a conductive metal silicide or combinations thereof. In one embodiment, the conductive material that is used in forming the at least one conductive feature 14 is a conductive metal such as Cu, W or Al. In another embodiment, the at least one conductive feature 14 is comprised of Cu or a Cu alloy (such as AlCu).

The conductive material is filled into the remaining opening in the first interconnect dielectric material 10 utilizing a conventional deposition process including, but not limited to, CVD, PECVD, sputtering, chemical solution deposition or plating. After deposition, a conventional planarization process such as, for example, chemical mechanical polishing (CMP) can be used to provide a structure in which the barrier layer 12 and the at least one conductive feature 14 each have an upper surface that is substantially coplanar with the upper surface of the first interconnect dielectric material 10.

After forming the at least one conductive feature 14, dielectric capping layer 16 is formed on the surface of the lower interconnect level (including atop the first interconnect dielectric material 10, the diffusion barrier 12, and the at least one conductive feature 14) utilizing a conventional deposition process such as, for example, CVD, PECVD, chemical solution deposition, or evaporation. The dielectric capping layer 16 includes any suitable dielectric capping material such as, for example, SiC, $Si_4NH_3$, $SiO_2$, a carbon doped oxide, a nitrogen and hydrogen doped silicon carbide SiC(N, H) or multilayers thereof. The thickness of the capping layer 16 may vary depending on the technique used to form the same as well as the material make-up of the layer. Typically, the dielectric capping layer 16 has a thickness from 15 nm to 55 nm, with a thickness from 25 nm to 45 nm being more typical.

Next, the upper interconnect level is formed by applying the second interconnect dielectric material 18 to the upper exposed surface of the dielectric capping layer 16. In one embodiment, the second interconnect dielectric material 18 may comprise a same dielectric material as that of the first interconnect dielectric material 10. In another embodiment, the second interconnect dielectric material 18 may comprise a different dielectric material as that of the first interconnect dielectric material 10. The processing techniques, thickness ranges and dielectric material for the first interconnect dielectric material 10 are also applicable here for the second interconnect dielectric material 18.

Next, at least one via opening 22 is formed into the second interconnect dielectric material 18 utilizing lithography, as described above, and etching. The etching may comprise a dry etching process, a wet chemical etching process or a combination thereof. The term "dry etching" is used herein to denote an etching technique such as reactive-ion etching, ion beam etching, plasma etching or laser ablation.

It is noted that during the formation of the at least one via opening 22, the etching step also removes a portion of the dielectric capping layer 16 that is located atop the at least one conductive feature 14 in order to make electrical contact between the upper and lower interconnect levels illustrated in the drawings. As such, during the formation of the at least one via opening 22 a portion of the at least one conductive feature 14 is exposed.

Figure 2:
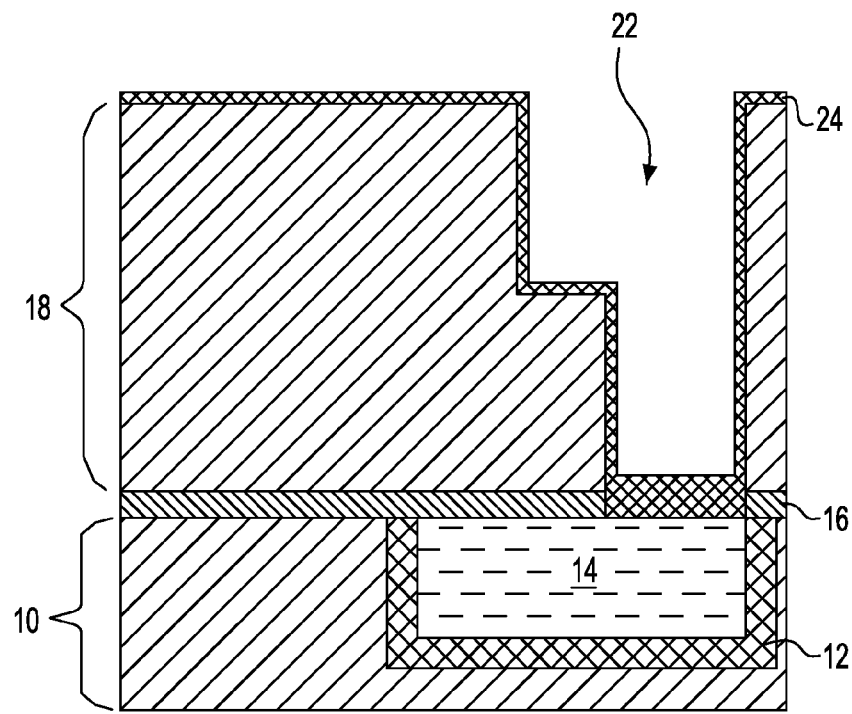
FIG. 2 is a pictorial representation (through a cross sectional view) depicting the structure of FIG. 1 after forming an electromigration and stress migration enhancement liner at least within the at least one via opening.

Referring to FIG. 2, there is illustrated the structure of FIG. 2 after forming an electromigration (EM) and stress migration (SM) enhancement liner 24 at least within the at least one via opening 22. As shown, a portion of the EM/SM enhancement liner 24 within the at least one via opening 22 covers exposed surfaces of the second interconnect dielectric material 18, and another portion covers exposed sidewalls of the opened dielectric cap 16 and an exposed surface of the underlying conductive feature 14. Also, and as illustrated, a further portion of the EM/SM enhancement liner 24 can be located outside of the at least one via opening 22 and atop the second interconnect dielectric material 18.

The EM/SM enhancement liner 24 that at can be employed in the present disclosure comprises a metal such as, for example, Co, Ru, Ir, Pt, Rh, W, Ti, Au, Ag, Pd or Os. In some embodiments of the present disclosure, at least two of the aforementioned metals such as, for example, an alloy of Co-Ru, can be employed and used as EM/SM enhancement liner 24.

In accordance with the present disclosure, the EM/SM enhancement liner 24 is comprised of a metal (metals) that has (have) a purity greater than 99%. Some minor impurities can be present within the EM/SM enhancement liner 24 depending on the conditions used to form the same. The presence of these impurities however do not affect the properties of the EM/SM enhancement liner 24. In some embodiments, the EM/SM enhancement liner 24 is comprised of a metal (metals) that has (have) a purity that equals 100%.

In one embodiment, the EM/SM enhancement liner 24 is a single layered structure. In another embodiment, the EM/SM enhancement liner 24 is a multilayered structure including two or more metal layers stacked atop each other. The EM/SM enhancement liner 24 can be formed utilizing a deposition process such as, for example, atomic layer deposition (ALD), chemical vapor deposition (CVD), and plasma enhanced chemical vapor deposition (PECVD).

The thickness, T1, of the EM/SM enhancement liner 24 that is present on the exposed sidewalls of the second interconnect dielectric material 18 within the at least one via opening 22 is typically within a range from 0.5 nm to 10 nm, with a thickness from 1 nm to 5 nm being even more typical. The thickness, T2, of the EM/SM enhancement liner 24 that is present on the exposed sidewalls of the dielectric cap 16 and atop the at least one conductive feature 14 and at the very bottom of the at least one via opening 22 is typically within a range from 1.5 nm to 30 nm, with a thickness from 3 nm to 15 nm being even more typical.

As such, the EM/SM enhancement liner 24 of the present disclosure has a portion that is at the bottom of the at least one via opening 22 whose thickness T2 is greater than the thickness T1 that is present on the remaining surfaces of the second interconnect dielectric material 18 within the at least one via opening 22. In the present disclosure and in one embodiment, T2 is at least three times greater than T1. In another embodiment, T2 is at least 5 times greater than T1. In yet a further embodiment of the present disclosure, T2 is at least 10 times greater than T1.

The difference in thickness of the EM/SM enhancement liner 24 is a result of the difference in nucleation time which is achieved on exposed surfaces of the patterned second interconnect dielectric material 18 as compared to the nucleation time that is achieved on the exposed surface of the at least one conductive feature 14. In the present disclosure and during the formation of the EM/SM enhancement liner 24, the deposition of the EM/SM enhancement liner 24 occurs immediately on the exposed surface of the conductive feature 14, while a much longer deposition time is required for formation of the EM/SM enhancement liner 24 on the exposed surfaces (i.e., sidewall portions) of the second interconnect dielectric material 18. Stated in other turns, the deposition rate of the EM/SM enhancement liner 24 is faster on the exposed surface of the at least one conductive feature 14 as compared to the deposition rate of the EM/SM enhancement liner 24 on the exposed surfaces of the second interconnect dielectric material 18. As such, the thickness of the EM/SM enhancement liner 24 at the bottom of the via opening is greater than that of the remaining EM/SM enhancement liner 24. In the present disclosure, and as illustrated, the EM/SM enhancement liner 24 at the bottom of the via opening is thicker that the adjacent dielectric cap layer 16.

Figure 3:
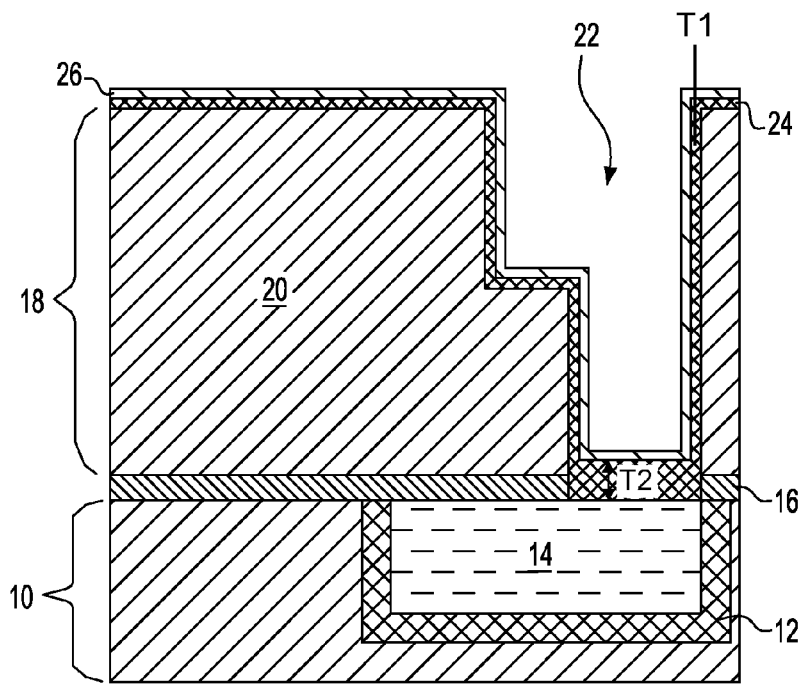
FIG. 3 is a pictorial representation (through a cross sectional view) depicting the structure of FIG. 2 after forming a diffusion barrier on the electromigration and stress migration enhancement liner at least within remaining portions of the at least one via opening.

Referring to FIG. 3, there is illustrated the structure of FIG. 2 after forming a diffusion barrier 26 on the EM/SM enhancement liner 24 at least within remaining portions of the at least one via opening 22. As shown, some portion of the diffusion barrier 26 is also formed atop the EM/SM enhancement liner 24 that is located outside of the at least one via opening 22.

The diffusion barrier 26 that can be employed in the present disclosure comprises a metal nitride such as, for example, TaN, TiN, RuN, RuTaN, WN or any other metal nitride material that can serve as a barrier to prevent a conductive material such as, for example, Cu, from diffusing there through. Combinations of these materials are also contemplated forming a multilayered stacked diffusion barrier. The diffusion barrier 26 can be formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the diffusion barrier 26 may vary depending on the number of material layers within the diffusion barrier 26, the technique used in forming the same as well as the material of the diffusion barrier 26 itself. Typically, the diffusion barrier 26 has a thickness from 1 nm to 10 nm, with a thickness from 2 nm to 5 nm being even more typical.

Figure 4:
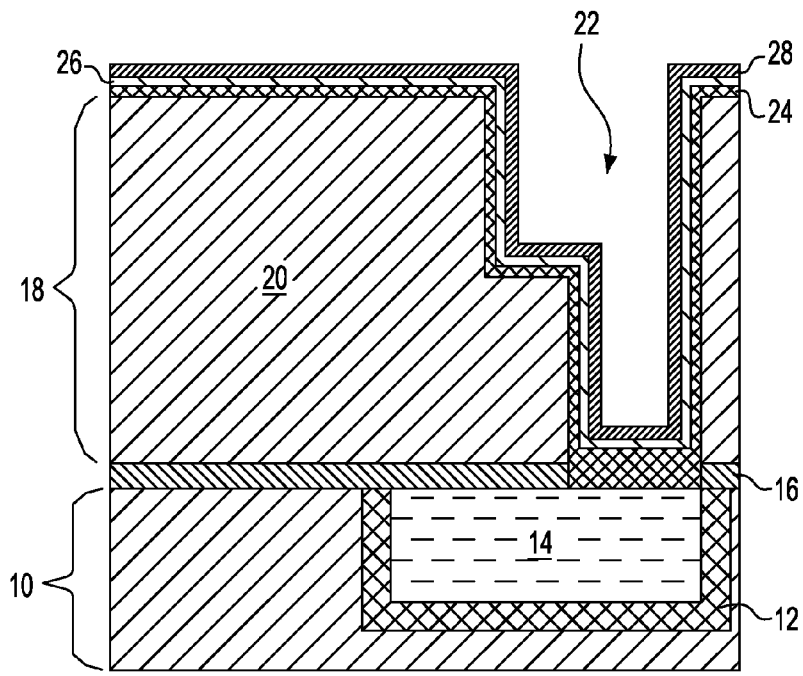
FIG. 4 is a pictorial representation (through a cross sectional view) depicting the structure of FIG. 3 after forming an adhesion liner on the diffusion barrier at least within remaining portions of the at least one via opening.

Referring to FIG. 4, there is illustrated the structure of FIG. 3 after forming an adhesion liner 28 on the diffusion barrier 26 at least within remaining portions of the at least one via opening 22.

As shown, some portion of the adhesion liner 28 is also formed atop the diffusion barrier 26 that is located outside of the at least one via opening 22.

The adhesion liner 28 that can be employed in the present disclosure comprises a metal such as, for example, Ta, Ti, Ru, Co, and W. Alloys of these metals can also be employed as the adhesion liner 28. The adhesion layer 28 may include a same or different metal as the metal present in the diffusion barrier 26. The adhesion liner 28 can be formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the adhesion liner 28 may vary depending on, for example, the technique used in forming the same as well as the material of the adhesion liner 28 itself. Typically, the adhesion liner 28 has a thickness from 1 nm to 10 nm, with a thickness from 2 nm to 5 nm being even more typical.

Figure 5:
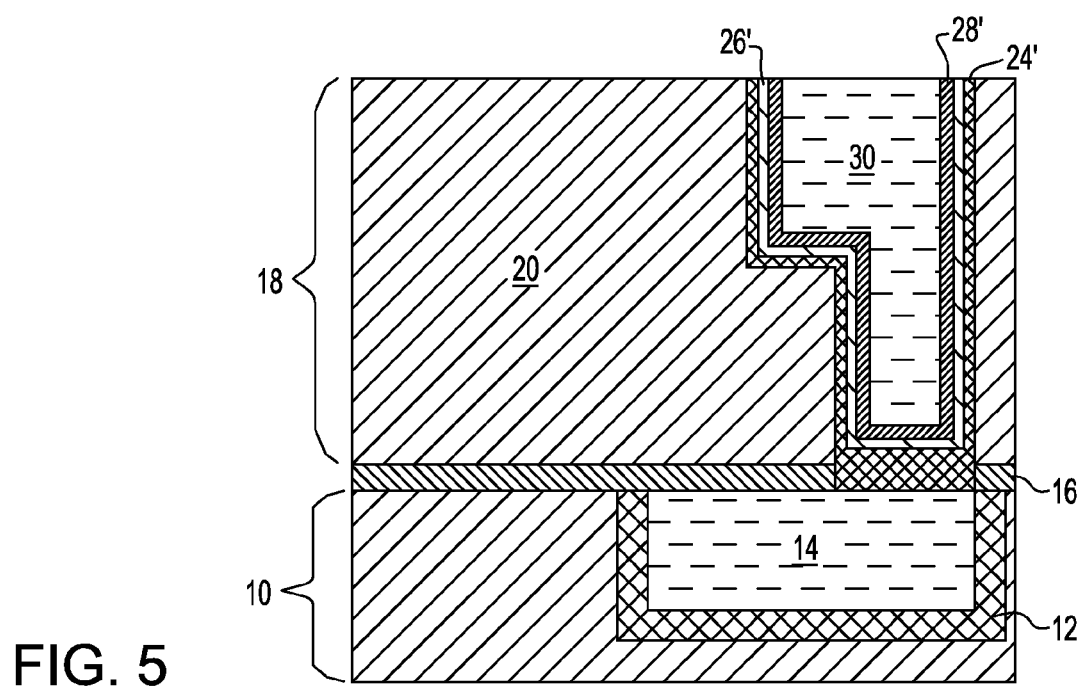
FIG. 5 is a pictorial representation (through a cross sectional view) depicting the structure of FIG. 4 after forming a conductive material atop the adhesion liner at least within remaining portions of the at least one via opening and planarization.

Referring to FIG. 5, there is illustrated the structure of FIG. 4 after forming a conductive region 30 atop the adhesion liner 28 at least within remaining portions of the at least one via opening 22.

In one embodiment, the conductive region 30 may comprise a same conductive material as that of the at least one conductive feature 14. In another embodiment, the conductive region 30 may comprise a different conductive material as that of the at least one conductive feature 14. In one embodiment, the conductive region 30 includes Cu, Al, W or alloys thereof are used. Typically, the conductive region 30 includes Cu or AlCu. The conductive region 30 can be formed utilizing the same deposition processing as described above in forming the at least one conductive feature 14 and following deposition of the conductive material, the structure is subjected to planarization providing the structure shown in FIG. 5.

The planarization process removes the portions of the EM/SM enhancement liner 24, the diffusion barrier 26, the adhesion layer 28 and conductive material that are present above the upper horizontal surface of the second interconnect dielectric material 18. In the drawings, reference numeral 24' denotes the remaining EM/SM enhancement liner after planarization, reference numeral 26' denotes the remaining diffusion barrier after planarization and reference numeral 28' denotes the remaining adhesion layer after planarization. As shown, elements 24', 26', 28' and 30 each have an upper surface that is coplanar with each other as well as with that of the upper surface of the second interconnect dielectric material 18.

It is also noted the remaining electromigration and stress migration enhancement liner 24', the remaining diffusion barrier 26', and the remaining adhesion liner 28 are contiguously present in the at least one via opening 22. By "contiguously present" it is meant that there are no breaks in any of elements 24', 26' and 28' within the at least one via opening 22.

In some embodiments, especially when Cu or a Cu alloy is employed as the conductive material used in forming conductive region 30, an optional plating seed layer (not shown) can be formed prior to forming the conductive material. The optional plating seed layer is employed to selectively promote subsequent electroplating of a pre-selected conductive metal or metal alloy. The optional plating seed layer may comprise Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, and PVD.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. An interconnect structure comprising:
   a first interconnect dielectric material having at least one conductive feature located therein;
   a dielectric capping layer located atop the first interconnect dielectric material and a portion of the at least one conductive feature;
   a second interconnect dielectric material located on said dielectric capping layer and having at least one via opening that is in contact with an exposed portion of the at least one conductive feature;
   an electromigration and stress migration enhancement liner is a metal and located within the at least one via opening, wherein a first portion of said electromigration and stress migration enhancement liner has a first thickness and is located on exposed sidewalls of said second interconnect dielectric material and a second portion of said electromigration and stress migration enhancement liner has a second thickness and is located on an upper surface of said exposed portion of the at least one conductive feature, and wherein said second thickness is at least 3 times greater than said first thickness and said first portion and said second portion of said electromigration and stress migration enhancement liner are of unitary construction;
   a diffusion barrier located on the electromigration and stress migration enhancement liner and within said at least one via opening;
   an adhesion liner located on the diffusion barrier and within said at least one via opening; and
   a conductive region located on the adhesion liner and within said at least one via opening.

2. The interconnect structure of claim 1, wherein said second thickness of said second portion of said electromigration and stress migration enhancement liner is at least 5 times greater than the first thickness of said first portion of said electromigration and stress migration enhancement liner.

3. The interconnect structure of claim 1, wherein said second thickness of said second portion of said electromigration and stress migration enhancement liner is at least 10 times greater than the first thickness of said first portion of said electromigration and stress migration enhancement liner.

4. The interconnect structure of claim 1, wherein said metal of said electromigration and stress migration enhancement liner comprises at least one of Co, Ru, Ir, Pt, Co, Ru, Ir, Pt, Rh, W, Ti, Au, Ag, Pd and Os.

5. The interconnect structure of claim 1, wherein said diffusion barrier is a metal nitride.

6. The interconnect structure of claim 5, wherein said metal nitride comprises at least one of TaN, TiN, RuN, RuTaN and WN.

7. The interconnect structure of claim 1, wherein said adhesion layer comprises at least one of Ta, Ti, Ru, Co and W.

8. The interconnect structure of claim 1, wherein said at least one via opening is a combined line and via opening.

9. The interconnect structure of claim 1, wherein said conductive region comprises Cu, Al, W or alloys thereof.

10. The interconnect structure of claim 1, wherein said electromigration and stress migration enhancement liner, said diffusion barrier, said adhesion liner and said conductive region each have an upper surface that is coplanar with each other and coplanar with an upper surface of the second interconnect dielectric material.

11. The interconnect structure of claim 1, wherein said electromigration and stress migration enhancement liner, said diffusion barrier, and said adhesion liner are contiguously present in said at least one via opening.

12. The interconnect structure of claim 1, wherein said second thickness of said second portion of said electromigration and stress migration enhancement liner at said bottom of said at least one via opening is greater than a thickness of the dielectric capping layer.

13. The interconnect structure of claim 1, wherein said first thickness is none zero.

14. The interconnect structure of claim 13, wherein said first thickness is from 0.5 nm to 10 nm and said second thickness is from 1.5 to 30 nm.

15. The interconnect structure of claim 1, wherein said metal has a purity of greater than 99%.

16. The interconnect structure of claim 1, wherein said electromigration and stress migration enhancement liner is a single layered structure.

17. The interconnect structure of claim 1, wherein said electromigration and stress migration enhancement liner is a multilayered structure containing at least two metal layers stacked atop each other.

18. The interconnect structure of claim 1, wherein said second portion of said electromigration and stress migration enhancement liner has a bottommost surface that is coplanar with a bottommost surface of said dielectric capping layer, and an uppermost surface that is extends above an uppermost surface of the dielectric capping layer.

19. The interconnect structure of claim 1, wherein said second portion of said electromigration and stress migration enhancement liner has a bottommost surface that does not extend beneath a bottommost surface of said dielectric capping layer.

* * * * *